(12) United States Patent
Drotleff et al.

(10) Patent No.: US 7,897,913 B2
(45) Date of Patent: Mar. 1, 2011

(54) IMAGE SENSING DEVICE HAVING A SHIELDING LAYER

(75) Inventors: Hans-Georg Drotleff, Leonberg (DE); Steffen Fritz, Wurmberg (DE); Michael Hadeler, Pliezhausen (DE)

(73) Assignee: Robert Bosch GmbH, Stuttgart (DE)

( * ) Notice: Subject to any disclaimer, the term of this patent is extended or adjusted under 35 U.S.C. 154(b) by 239 days.

(21) Appl. No.: 11/794,749

(22) PCT Filed: Dec. 5, 2005

(86) PCT No.: PCT/EP2005/056467

§ 371 (c)(1),
(2), (4) Date: May 26, 2009

(87) PCT Pub. No.: WO2006/072518

PCT Pub. Date: Jul. 13, 2006

(65) Prior Publication Data

US 2009/0294629 A1  Dec. 3, 2009

(30) Foreign Application Priority Data

Jan. 4, 2005  (DE) .................. 10 2005 000 655

(51) Int. Cl.
*H01L 27/00* (2006.01)

(52) U.S. Cl. .................... 250/239; 250/208.1

(58) Field of Classification Search .................. 250/239, 250/208.1, 226, 370.09; 235/462.43
See application file for complete search history.

(56) References Cited

U.S. PATENT DOCUMENTS

| | | | |
|---|---|---|---|
| 4,161,655 A * | 7/1979 | Cotic et al. ............... | 250/385.1 |
| 6,027,958 A * | 2/2000 | Vu et al. ..................... | 438/110 |
| 7,270,274 B2 * | 9/2007 | Hennick et al. ........ | 235/462.43 |
| 2002/0006687 A1 | 1/2002 | Lam | |
| 2002/0080248 A1 | 6/2002 | Adair et al. | |
| 2004/0056956 A1 | 3/2004 | Gardiner | |
| 2004/0085476 A1 | 5/2004 | Whalen | |

FOREIGN PATENT DOCUMENTS

| | | |
|---|---|---|
| EP | 0 828 298 | 3/1998 |
| JP | 07 038789 | 2/1995 |
| JP | 11239288 | 8/1999 |
| JP | 2002368481 | 12/2002 |
| JP | 2003086907 | 3/2003 |
| JP | 2005 117123 | 4/2005 |

* cited by examiner

*Primary Examiner*—Tony Ko
(74) *Attorney, Agent, or Firm*—Kenyon & Kenyon LLP

(57) ABSTRACT

In an image sensing device having a housing, having a circuit assemblage disposed on a circuit board, and having an image sensor that is disposed on a circuit board and in front of an opening of the housing, in order to improve the shielding effect, at least one shielding layer is disposed on the circuit board carrying the image sensor.

11 Claims, 2 Drawing Sheets

IMAGE SENSING DEVICE HAVING A SHIELDING LAYER

BACKGROUND INFORMATION

An image sensing device encompasses at least one image sensor that senses optical signals and converts them into electrical signals, as well as an electronic circuit assemblage for processing the output signals generated by the image sensor. The image sensor and the electronic circuit assemblage are usually combined physically into one housing, which has at least one opening to allow the image sensor to sense optical signals. Image sensing devices of the species are used, for example, as an assembly in vehicle-based assistance systems, and serve there for optical sensing of the vehicle environment. On the one hand, very high clock frequencies are used in the context of digital signal processing that is often encountered today. The risk exists here that spurious radiation may get into the environment. On the other hand, components that are themselves sensitive to spurious radiation are incorporated into the image sensing device, and must be shielded from external spurious radiation. In terms of design, therefore, particular care must be taken to embody the housing to be resistant to spurious radiation. Ideally, no internally generated spurious radiation should penetrate to the outside. On the other hand, however, the inward penetration of external spurious radiation also needs to be reliably prevented. A housing embodied in radiation-tight fashion is necessary for this approach. In the image sensing devices of the species, however, the housing opening necessary for the image sensor or its optical system constitutes a system-related weak point. Because an opening is present here in the housing, the risk exists that spurious radiation might enter or leave the housing. The EMC (electromagnetic compatibility) properties are thereby disadvantageously influenced. Attempts have already been made to remedy this shortcoming by also coating the optical system of the image sensor itself with a layer exhibiting a shielding effect with respect to electromagnetic radiation. This solution has the disadvantage, however, that the optical properties of the image sensor are usually negatively affected thereby.

Japanese Patent No. JP-2002368481 describes a shielding housing for an electronic circuit that exhibits, in its edge region, spring means for resilient connection with a carrier of the electronic circuit.

Japanese Patent No. JP-2003086907 describes a flexible circuit board for an electronic circuit that carries a shielding layer and a cover layer disposed thereupon.

Japanese Patent No. JP-11239288 describes a camera housing having a window opening for an image sensor. The window opening is closed off with electrically conductive glasses.

SUMMARY OF THE INVENTION

The manner according to the present invention of achieving the object offers the advantage of an improved shielding effect with respect to spurious electromagnetic radiation with no impairment of the optical properties of the image sensor. The present invention exploits the realization that a particularly good shielding effect is achievable by the fact that the circuit board carrying the image sensor is covered with a highly conductive shielding layer that is in turn connected, via connecting means, to housing conductors on the electronic circuit assemblage and to the housing of the image sensing device. Advantageously, the connecting means are embodied flexibly. This simplifies assembly and alignment of the image sensor in a preferred installation location. Advantageously, the connecting means are a part or a continuation of the shielding layer. They can thus be stamped out from one panel simultaneously with the shielding layer.

DETAILED DESCRIPTION

Figure 1:
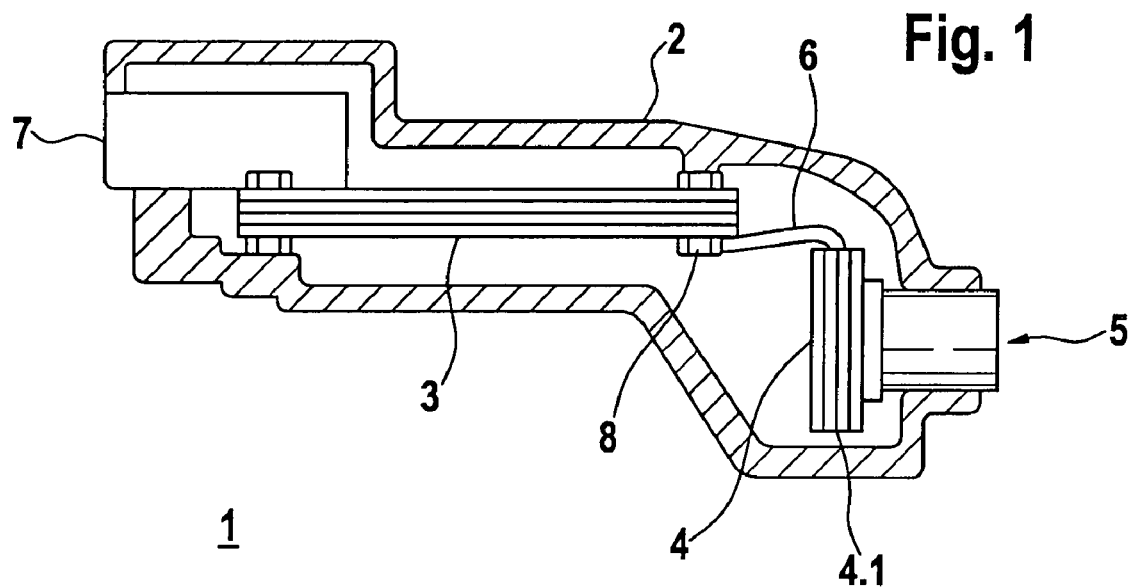
FIG. 1 is a sectioned depiction of an image sensing device.

An exemplary embodiment of the present invention is described below with reference to the drawings. FIG. 1 shows an image sensing device 1. The latter encompasses an image sensor 5 equipped if applicable with an optical system such as a lens combination, which sensor is disposed on a circuit board 4. Image sensing system 1 further encompasses a circuit board 3 that carries an electronic circuit assemblage (not depicted here in detail). Circuit boards 3 and 4 are preferably so-called multi-layer circuit boards, with which a variety of circuit functions can be implemented in space-saving fashion. This circuit assemblage is electrically operatively connected to image sensor 5, and serves to process the output signals delivered by image sensor 5. Image sensor 5 with its circuit board 4, and circuit board 3, are disposed in a housing 2. Image sensor 5 is disposed in an opening of housing 2, since it is intended to acquire optical signals with no interference from housing 2. Also provided in the housing is a plug connector 7 by way of which an electrical connection can be created to downstream electronic systems (not depicted here). In order to achieve the best possible shielding effect despite the opening in housing 2 required because of image sensor 5, at least one shielding layer 4.1 is disposed on circuit board 4 that carries image sensor 5. Advantageously, this shielding layer 4.1 is connected via connecting means 6, in electrically highly conductive fashion, to housing conductors on circuit board 3 and to housing 2. Shielding layer 4.1 is usefully made of a material of high electrical conductivity, such as copper in particular. In order to facilitate flexible alignment of image sensor 5 with reference to circuit board 3 and/or housing 2, connecting means 6 are preferably made of a flexible material such as, for example, a copper foil. Connecting means 6 can advantageously be part of shielding layer 4.1 or a continuation thereof.

In a variant embodiment of the present invention, shielding layer 4.1 can be integrated into circuit board 4 that is embodied as a multi-layer, i.e. can constitute an internal ply thereof. In other variant embodiments of the present invention, the shielding layer can also be mounted on an external surface of circuit board 4. In a further variant embodiment, multiple shielding layers 4.1 can also be provided, at least one of which is integrated into the interior of circuit board 4 and is applied on an external surface of circuit board 4.

The housing conductor disposed on circuit board 3 is preferably configured, in terms of its dimensions, so that it forms a clamping edge 8 for the housing. Correspondingly adapted parts of housing 2, which preferably is in at least two parts, then come to rest against the clamping edge 8 upon assembly of the housing parts, thus enabling a good electrical contact that improves the shielding effect.

Figure 2:
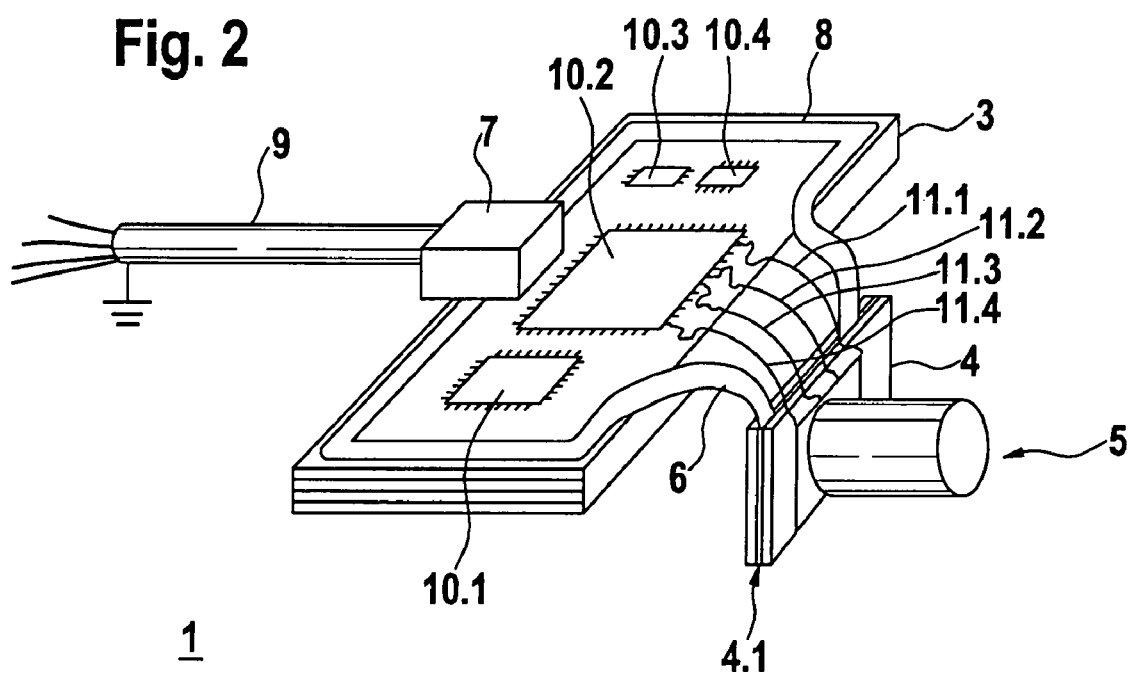
FIG. 2 is a perspective depiction of components of the image sensing device.

FIG. 2 is a perspective depiction of the components disposed in housing 2 (not shown here). Here as well, it is once again clearly apparent that as a result of the flexible configuration of connecting means 6, circuit board 4 along with image sensor 5 disposed thereon is pivotable over a large angular range, so that image sensor 5 can be brought into an optimally aligned installation position. Connecting means 6 connect shielding layer 4.1 (integrated into circuit board 4) to clamping edge 8 on circuit board 3, which edge encloses, preferably annularly, electronic components 10.1, 10.2, 10.3, 10.4 disposed on the surface of the circuit board. Connecting conductors 11.1, 11.2, 11.3, 11.4 (here depicted merely by way of example) between circuit board 3 and circuit board 4 also benefit from the shielding effect resulting from clamping edge 8, connecting means 6, and shielding layer 4.1. In addition, FIG. 2 also shows a connecting cable 9 inserted into plug connector 7.

What is claimed is:

1. An image sensing device, comprising:
    first and second circuit boards;
    a housing;
    a circuit assemblage situated on the first circuit board;
    an image sensor situated on the second circuit board and in front of an opening of the housing;
    at least one electromagnetic shielding layer situated on the second circuit board carrying the image sensor; and
    a connecting arrangement situated between the shielding layer and the first circuit board carrying the circuit assemblage, the connecting arrangement being embodied flexibly;
    wherein the connecting arrangement is a part or a continuation of the shielding layer, wherein the shielding layer is composed of a material having good electrical conductivity,
    wherein the shielding layer is integrated into the second circuit board that is embodied as a multi-layer, forming an internal ply of the multi-layer circuit board, and
    wherein conductors situated on the first circuit board are embodied as a housing clamping edge.

2. The image sensing device according to claim 1, wherein the at least one shielding layer is connected in electrically conductive fashion to housing conductors of the first circuit board and to the housing.

3. The image sensing device according to claim 1, wherein the circuit boards are multi-layer circuit boards.

4. The image sensing device according to claim 1, wherein the shielding layer is composed of copper.

5. The image sensing device according to claim 1, wherein the shielding layer is composed of a copper foil.

6. The image sensing device according to claim 1, wherein the shielding layer forms at least one externally located layer of the multi-layer circuit board.

7. The image sensing device according to claim 1, wherein conductors situated on the first circuit board are embodied as a housing clamping edge.

8. The image sensing device according to claim 1, wherein the shielding layer is configured to at least one of prevent spurious radiation to get into the environment and protect the circuit boards from external spurious radiation.

9. An image sensing device, comprising:
    first and second circuit boards;
    a housing;
    a circuit assemblage situated on the first circuit board;
    an image sensor situated on the second circuit board and in front of an opening of the housing;
    at least one electromagnetic shielding layer situated on the second circuit board carrying the image sensor; and
    a connecting arrangement situated between the shielding layer and the first circuit board carrying the circuit assemblage, the connecting arrangement being embodied flexibly,
    wherein the at least one shielding layer is connected in electrically conductive fashion to housing conductors of the first circuit board and to the housing, wherein the circuit boards are multi-layer circuit boards,
    wherein the connecting arrangement is a part or a continuation of the shielding layer,
    wherein the shielding layer is composed of a material having good electrical conductivity,
    wherein the shielding layer forms at least one externally located layer of the multi-layer circuit board,
    wherein conductors situated on the first circuit board are embodied as a housing clamping edge, and
    wherein the shielding layer is configured to at least one of prevent spurious radiation to get into the environment and protect the circuit boards from external spurious radiation.

10. The image sensing device according to claim 9, wherein the shielding layer is composed of copper.

11. The image sensing device according to claim 9, wherein the shielding layer is: composed of a copper foil.

* * * * *